US007471145B2

(12) United States Patent
Groiss

(10) Patent No.: US 7,471,145 B2
(45) Date of Patent: Dec. 30, 2008

(54) PROCEDURE AND CIRCUIT DEVICE FOR THE SUBTRACTION OF ELECTRICAL SIGNALS

(75) Inventor: Stefan Groiss, Villach-Landskron (AT)

(73) Assignee: Infineon Technologies AG, Munich (DE)

( * ) Notice: Subject to any disclaimer, the term of this patent is extended or adjusted under 35 U.S.C. 154(b) by 169 days.

(21) Appl. No.: 11/337,810

(22) Filed: Jan. 24, 2006

(65) Prior Publication Data

US 2006/0187091 A1 Aug. 24, 2006

(30) Foreign Application Priority Data

Jan. 25, 2005 (DE) ........................ 10 2005 003 466

(51) Int. Cl.
*H03F 3/45* (2006.01)

(52) U.S. Cl. ........................................ 330/69; 327/361

(58) Field of Classification Search .................. 330/69; 327/361

See application file for complete search history.

(56) References Cited

U.S. PATENT DOCUMENTS 4,683,441 A * 7/1987 Naylor ........................ 330/69
5,841,311 A * 11/1998 Koike ......................... 327/361

OTHER PUBLICATIONS

Kim, J. et al. (1994). "MOS Active Attenuators for Analog ICs and their Applications to Finite Gain Amplifiers," *IEEE International Symposium on Circuits and Systems*, pp. 701-704.

* cited by examiner

*Primary Examiner*—Steven J Mottola
(74) *Attorney, Agent, or Firm*—Slater & Matsil, L.L.P.

(57) ABSTRACT

The invention relates to a procedure and a circuit device for the subtraction of electrical signals, with at least two regulating loops each comprising at least one amplifier unit. Advantageously, the circuit device comprises a device for subtracting a signal, made available by the circuit device and representing the difference between the electrical signals, from one of the electrical signals. In a preferred embodiment of the invention, the potentials on lines carrying the electrical signals are maintained at the same value with the help of a first one or of the regulating loops.

19 Claims, 2 Drawing Sheets

PROCEDURE AND CIRCUIT DEVICE FOR THE SUBTRACTION OF ELECTRICAL SIGNALS

CLAIM FOR PRIORITY

This application claims the benefit of priority to German Application No. 10 2005 003 466.7, filed in the German language on Jan. 25, 2005, the contents of which are hereby incorporated by reference.

TECHNICAL FIELD OF THE INVENTION

The invention relates to a procedure and a circuit device for the subtraction of electrical signals.

BACKGROUND OF THE INVENTION

In semi-conductor components, in particular for example in corresponding integrated (analog and/or digital) computing circuits, for example micro-processors and/or micro-controllers etc. and semi-conductor memory components, as well as other electrical circuits and/or signal-processing systems, for example filter circuits, digital-analog converters, amplifiers, regulators, etc. the problem that often needs to be solved is the subtraction of corresponding electrical signals from each other with a high degree of accuracy.

The electrical signals to be subtracted from each other could for example be generated by sensors and/or by corresponding circuit configurations, etc.

Relatively simply constructed state of the art assemblies, for instance a simple current node are available, with which electrical signals can be subtracted from each other. A common disadvantage here is among others often the fact that distortions and/or non-linearities are not able to be corrected with such simple devices.

In FIG. 1 an example of a conventional simple circuit device 1 for the subtraction of electrical signals (here: of currents I_1 and I_2 present on corresponding lines 5, 6) is shown.

This comprises two n-channel field effect transistors 2, 3—constituting a current mirroring device—, and an operational amplifier 4.

As is apparent from FIG. 1, the gate of the n-channel field effect transistor 2 is connected via a line 10 with the gate of the n-channel field effect transistor 3, and is connected via a line 7 with the above line 5, and back-connected via a line 8 with the drain of the n-channel field effect transistor 2.

The source of the n-channel field effect transistor 2 is connected to ground via a line 9.

In correspondingly similar fashion the source of the n-channel field effect transistor 3 is connected to ground (here: via a line 11).

As is further apparent from FIG. 1, the n-channel field effect transistor 3 (more accurately: the drain of the n-channel field effect transistor 3) can be connected via a line 13 with a first input of the operational amplifier 4, and the n-channel field effect transistor 2 (more accurately: the drain of the n-channel field effect transistor 2) can be connected via a line 14 with a second input of the operational amplifier 4.

The output of the operational amplifier 4 is back connected via a line 12 with the (first) operational amplifier-input.

With the help of the operational amplifier 4 it is attempted to regulate the potential at the drain of the n-channel field effect transistor 3 (i.e. the potential at a Point B of the circuit device 1 illustrated in FIG. 1) to the potential at the drain of the n-channel field effect transistor 2 (i.e. the potential at a Point A of the circuit device 1 illustrated in FIG. 1).

The purpose of this measure is the elimination of subtraction faults that can be ascribed to early voltages at the n-channel field effect transistors 2, 3 (and thereby of a major distortion component of subtraction faults) from the differential current I_diff made available by the circuit device 1 (detectable at line 13).

One problem is inter alia that the variable gain amplification of the operational amplifier 4—and/or of other conventional variable gain amplifier circuits—may be too small for the above purpose. In particular a p-channel field effect transistor 15 provided in the operational amplifier 4 may have insufficient regulatory scope for particular applications (in particular for example due to the fact that the threshold potential in n-channel field effect transistors is generally lower than that in p-channel field effect transistors). For an adequate regulatory scope the gate of the p-channel field effect transistor 15 would have to be moved towards negative voltages (which is not permissible, due to the corresponding voltage lift required).

A further disadvantage of the circuit device 1 shown in FIG. 1 to be mentioned is for example the fact that the threshold voltages of an n and a p-channel field effect transistor operate against each other as a result of the diode characteristics of the n-channel field effect transistor 2, and of the p-channel field effect transistor 15 provided in the operational amplifier 4 and functioning as a control transistor, which can be a considerable disadvantage regarding the robustness of the circuit device 1 against process and/or manufacturing inaccuracies.

SUMMARY OF THE INVENTION

The invention provides a procedure and circuit device for the subtraction of electrical signals, in particular a procedure and a circuit device, with which the above and/or further disadvantages of conventional subtraction procedures and/or circuit devices can—at least partly—be eliminated and/or avoided.

In one embodiment of the invention, there is a circuit device for the subtraction of electrical signals (S_in_1, S_in_2; I_1, I_2) with at least two regulating loops each comprising at least one amplifier unit.

Advantageously, the circuit device can comprise a device for subtracting a signal (S_diff, I_diff) made available by the circuit device and representing the difference between the electrical (input) signals (S_in_1, S_in_2) from one of the (input) signals (S_in_2).

In another embodiment of the invention, the potentials on lines carrying the electrical (input) signals (I_1, I_2) are kept at the same value with the help of a first one of the regulating loops.

Advantageously, the circuit device comprises several transistors provided in the signal path of the circuit device, whereby the transistors provided in the signal path of the circuit device are all of the same type (for example NMOS field effect transistors, or—alternatively—PMOS field effect transistors, etc.).

BRIEF DESCRIPTION OF THE DRAWINGS

The invention is described below in more detail with reference to the exemplary embodiments and drawings. In the drawings.

DETAILED DESCRIPTION OF THE INVENTION

Figure 1:
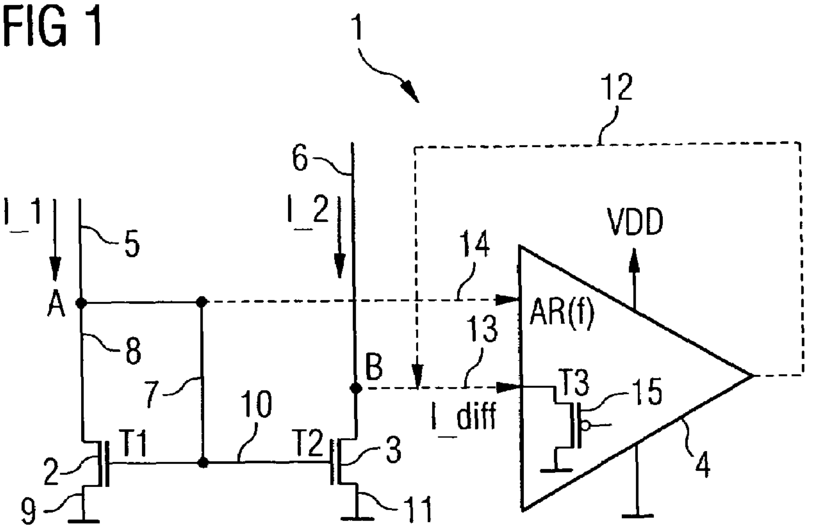
FIG. 1 shows, as an example, a circuit device for the subtraction of electrical signals in terms of state of the art technology.
Figure 2:
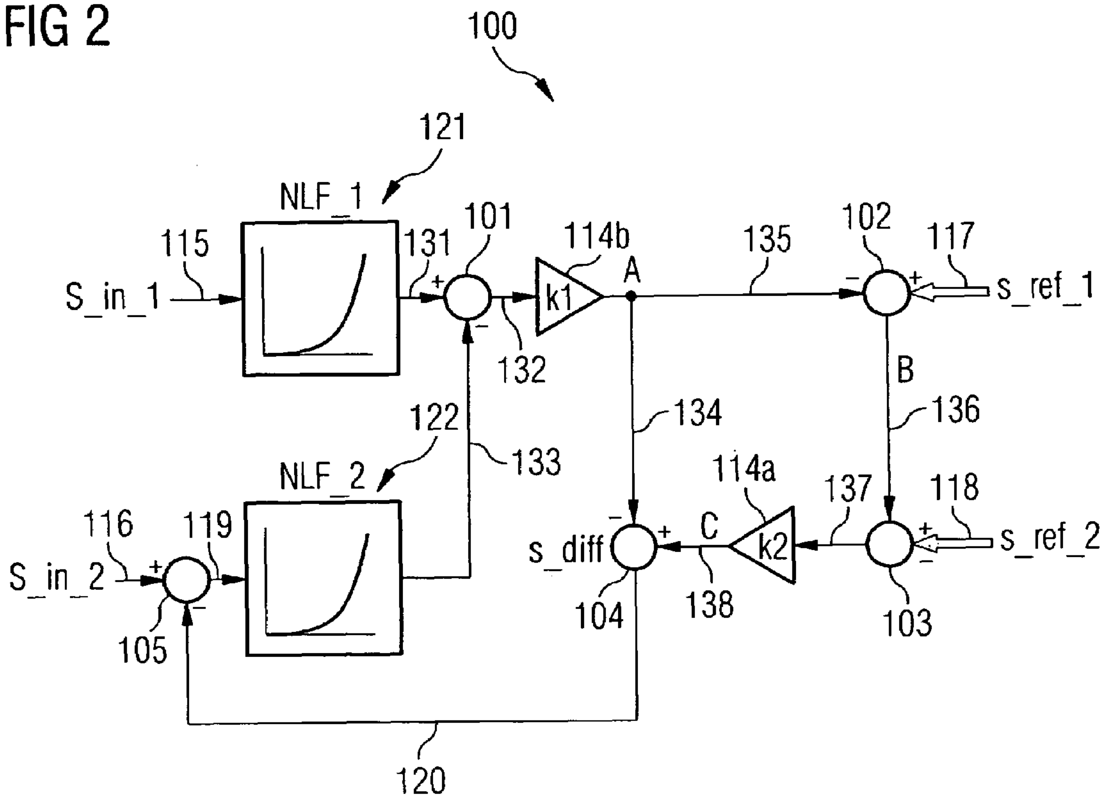
FIG. 2 shows, as an example, a principle circuit diagram of a circuit device for the subtraction of electrical signals according to an embodiment of the invention.

In FIG. 2—schematically and as an example—a principle circuit diagram of a circuit device 100 for the subtraction of electrical (input) signals S_in_1 and S_in_2 present on corresponding signal lines 115, 116, according to an embodiment example of the invention is shown.

As is apparent from FIG. 2, the circuit device 100 comprises two amplifier units 114*b*, 114*a*, which may be constituted by corresponding control technology amplifier blocks.

The higher the amplification factor k1, k2 of the amplifier units 114*b*, 114*a* and/or amplifier blocks, the higher the accuracy achieved in the subtraction of the electrical signals S_in_1 and S_in_2 by the circuit device 100.

The circuit device 100 comprises a plurality of subtraction units (here: the subtraction units 101, 102, 103, 104, 105).

Continuing to refer to FIG. 2, the input signals S_in_1 and S_in_2 (and/or the signals obtained from them and for example provided by the subtraction unit 105 to a line 119 (see below)) can be conveyed—without any substantial changes in the control technology characteristics achieved—via non-linear function blocks 121, 122 and/or NLF_1, NLF_2 representing corresponding non-linearities.

Such non-linear functions can for instance be caused by transistors exhibiting corresponding non-linear characteristic lines, or for example by non-linear digital relaying systems, etc., and/or may originate from non-linear output signals of physical-electrical sensors, etc., etc.

In terms of FIG. 2, the output signals of the non-linear function blocks 121, 122 are relayed via the signal lines 131, 133 to the subtraction unit 101 (for example the output signal of the function block 121 to its plus input, and the output signal of the function block 122 to its minus input)and subtracted from each other by the subtraction unit 101.

Instead of the above non-linear function blocks 121, 122—representing corresponding non-linearities—the above input signals S_in_1 and S_in_2 (and/or signals derived from them, for example made available by the subtraction unit 105 to the line 119 (see below)) can of course also be relayed to the subtraction unit 101 via corresponding linear functions (or relayed—essentially unchanged—directly to the subtraction unit 101).

The signal generated by the subtraction unit 101 is relayed via a signal line 132 to the amplifier unit 114*b*, which amplifies it by the above amplification factor k1.

The higher the amplification factor k1 of the amplifier unit 114*b*, the smaller the fault of the output signal S_diff of the circuit device 100 more closely described below.

The amplified signal (signal A) generated by the amplifier unit 114*b* is led via a signal line 134 to a first input of the subtraction unit 104 (here: to its minus input).

In addition the amplified signal (signal A) generated by the amplifier unit 114*b* is led via a signal line 135 to a first input of the subtraction unit 102 (here: also to its minus input).

As is further apparent from FIG. 2, a reference signal S_ref_1 is applied to a second input of the subtraction unit 102 (here: to its plus input) relayed via a signal-line 117.

The subtraction unit 102 subtracts the amplified signal (signal A) generated by the amplifier unit 114*b* and present at the minus input, from the reference signal S_ref_1 present at the plus input.

The signal (signal B) generated by the subtraction unit 102 in this fashion, is led via a signal line 136 to a first input of the subtraction unit 103 (here: to its plus input).

In terms of FIG. 2 a further reference signal S_ref_2, relayed via a signal line 118, is applied to a second input of the subtraction unit 103 (here: to its minus input).

The subtraction unit 103 subtracts the reference signal S_ref_2 present at the minus input from the signal (signal B) which is generated by the subtraction unit 102 and is present at the signal line 136.

The signal generated in this fashion by the subtraction unit 103 is relayed via a signal line 137 to the amplifier unit 114*a*, which amplifies it by the above amplification factor k2.

The amplified signal (signal C) generated by the amplifier unit 114*a* is relayed via a signal line 138 to a second input of the subtraction unit 104 (here: to its plus input).

The subtraction unit 104 subtracts the amplified signal (signal C), generated by the amplifier unit 114*a*, present at the plus input from the signal (signal A) generated by the amplifier unit 114*b* present at the signal line 134.

The differential signal S_diff generated by the subtraction unit 104 in this way—representing the difference between the input signals S in_1 and S_in_2 and constituting the output signal of the circuit device 100—is relayed via a signal line 120 to a first input of the subtraction unit 105 (here: to its minus input).

As is apparent from FIG. 2, the input signal S_in_2, relayed via the above signal line 116, is applied to a second input of the subtraction unit 105 (here: to its plus input).

The subtraction unit 105 subtracts the differential signal S_diff present at the minus input and generated by the subtraction unit 104 present at signal-line 120, from the input signal S_in_2 relayed via the above signal line 116 to the plus input of the subtraction unit 105.

The signal generated in this way by the subtraction unit 105 is relayed via the above signal line 119 to the above non-linear (or alternatively: linear) function block 122.

With the help of the above reference signals S_ref_1, S_ref_2—present at the signal-lines 117, 118—the operation point of the circuit device 100 can be adjusted, in particular in order to adapt the circuit device 100 to the parameters of the non-linearities—represented by the non-linear function blocks 121, 122—present in each case.

If the non-linearities represented by the non-linear function blocks 121, 122 and/or NLF_1, NLF_2 are essentially identical (i.e. if NLF_1≈NLF_2), S_ref_2<S_ref_1 can for example represent a suitable adjustment setting.

The input signals S_in_1 and S_in_2 normally differ from each other, which is why, in the above circuit device 100—as described above—, the difference to be determined, in other words the above differential signal S_diff is subtracted from the input signal S_in_2 by the subtraction unit 105.

The above signal B, present on the signal line 136 and generated by the subtraction unit 102, exhibits approximately the same order of magnitude as the reference signal S_ref_2 present on signal-line 118.

The reason for this is that the difference between the reference signal S_ref_2, and the signal B present on the line 136 and generated by the subtraction unit 103, is regulated to minimal values by the regulating loop comprising the amplifier unit 114*a*. The bigger the amplification factor k2 of the amplifier unit 114*a*, the sooner the signal B present on line 136 achieves parity with the reference signal S_ref_2.

It is important for the total amplification factors of the regulating loop comprising the amplifier unit 114*a*, and for example the signal lines 135, 136, 138, and of the regulating loop comprising the amplifier unit 114*b* and the non-linear function block 122, as well as for example the signal-lines 120, 135, 136, to be large enough to create the output signal S_diff of the circuit device 100 (i.e. the differential signal S_diff present on line 120) stably and with high accuracy.

Below, an example of a circuit device 200 for realizing the signal-difference creation principle, as described with the help of FIG. 2, is illustrated by use of FIG. 3.

Figure 3:
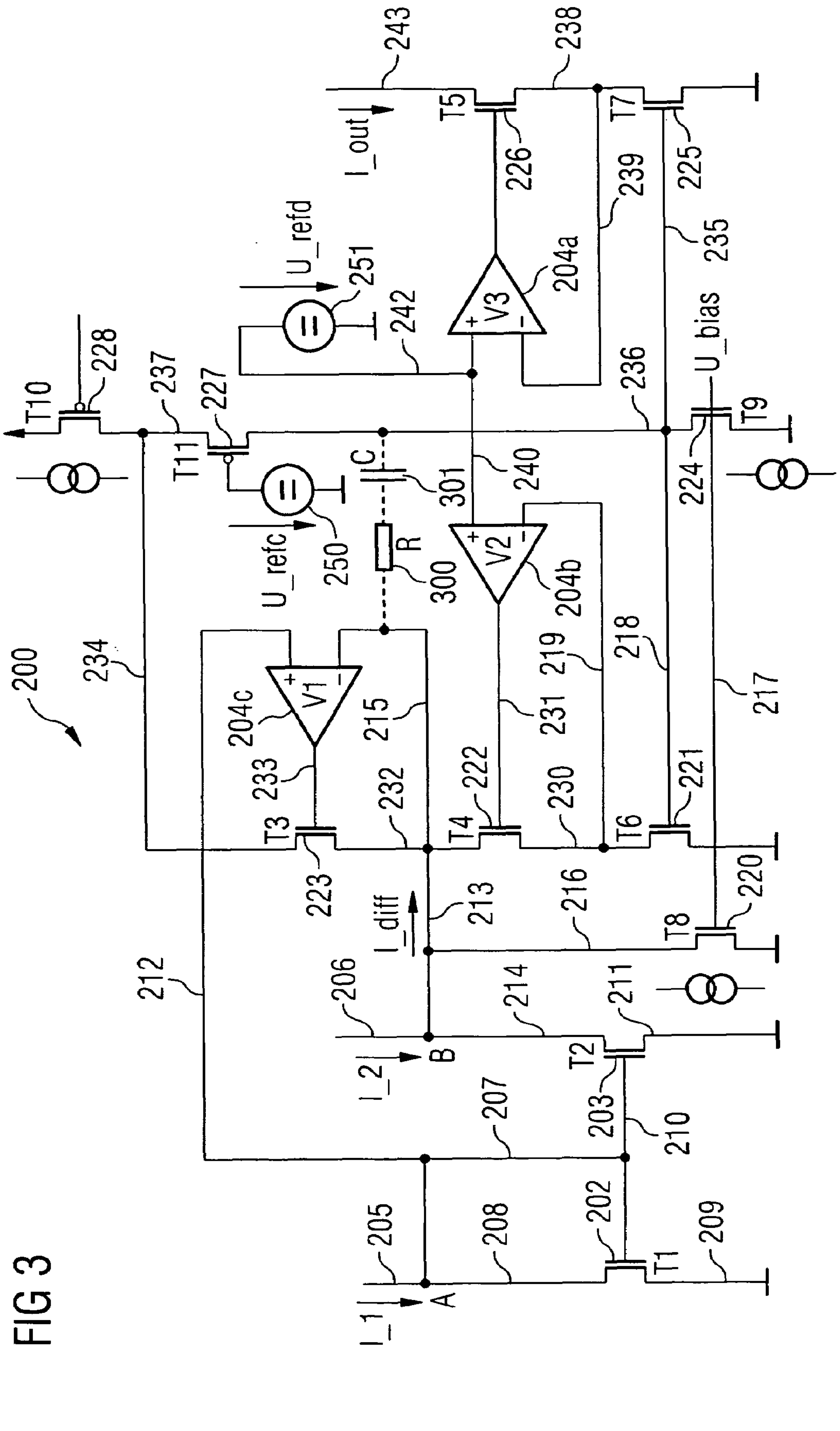
FIG. 3 shows, as an example, a circuit device for the subtraction of electrical signals putting into practice the signal subtraction principle illustrated in FIG. 2.

As is apparent from FIG. 3, the circuit device 200 for the subtraction of electrical signals (here: of currents I_1 and I_2 present on corresponding lines 205, 206) illustrated there, comprises two n-channel field effect transistors 202, 203 (transistor T1, and transistor T2), constituting a current-mirroring device.

In addition, the circuit device 200 comprises several (here: three) operational amplifiers 204*a*, 204*b*, 204*c*, as well as several further transistors (here: several n-channel field effect transistors 220, 221, 222, 223, 224, 225, 226, and several p-channel field effect transistors 227, 228).

As is apparent from FIG. 3, the gate of the n-channel field effect transistor 202 is connected via a line 210 with the gate of the n-channel field effect transistor 203, via a line 207 with the above line 205 and back-connected via a line 208 with the drain of the n-channel field effect transistor 202.

The source of the n-channel field effect transistor 202 is connected via a line 209 to ground.

In corresponding fashion the source of the n-channel field effect transistor 203 is also connected to ground (here: via a line 211).

As is further apparent from FIG. 3, the n-channel field effect transistor 203 (more accurately: the drain of the n-channel field effect transistor 203) is connected via corresponding lines 214, 213, 215 with the minus input of the operational amplifier 204*c*, and the n-channel field effect transistor 202 (more accurately: the drain and the gate of the n-channel field effect transistor 202) is connected via a line 212 with the plus input of the operational amplifier 204*c*.

The drain of the n-channel field effect transistor 220 (transistor T8) is connected via a line 216 with line 213 (and thereby inter alia also with the minus input of the operational amplifier 204*c*, and with the drain of the n-channel field effect transistor 203).

The source of the n-channel field effect transistor 220 is connected to ground and the gate of the n-channel field effect transistor 220 is connected via a line 217 with the gate of the n-channel field effect transistor 224 (transistor T9).

As is further apparent from FIG. 3, the source of the n-channel field effect transistor 221 (transistor T6) is connected to ground; the gate of the n-channel field effect transistor 221 is connected via a line 218 with the drain of the n-channel field effect transistor 224. In addition the drain of the n-channel field effect transistor 221 is connected via a line 219 with the minus input of the operational amplifier 204*b*, as well being connected via a line 230 with the source of the n-channel field effect transistor 222 (transistor T4).

The gate of the n-channel field effect transistor 222 is connected via a line 231 with the output of the operational amplifier 204*b*; the drain of the n-channel field effect transistor 222 is connected via a line 232 with the source of the n-channel field effect transistor 223 (transistor T3) and connected with the above line 213 and the above line 215.

The gate of the n-channel field effect transistor 223 is connected via a line 233 with the output of the operational amplifier 204*c*; the drain of the n-channel field effect transistor 223 is connected via a line 234 with the source of the p-channel field effect transistor 227 (transistor T11), and with the drain of the p-channel field effect transistor 228 (transistor T10).

The drain of the n-channel field effect transistor 224 is connected via a line 235 with the gate of the n-channel field effect transistor 225 (transistor T7), and is connected via a line 236 with the drain of the p-channel field effect transistor 227.

The source of the p-channel field effect transistor 227 is connected via a line 237 with the drain of the p-channel field effect transistor 228, of which the source can be connected with the supply voltage.

In terms of FIG. 3, the drain of the n-channel field effect transistor 225 is connected via a line 238 with the source of the n-channel field effect transistor 226 (transistor T5), and is connected via a line 239 with the minus input of the operational amplifier 204*a*.

The plus input of the operational amplifier 204*a* is connected via a line 240 with the plus input of the operational amplifier 204*b*; the output of the operational amplifier 204*a* is connected via a line 241 with the gate of the n-channel field effect transistor 226, of which the drain is connected with a line 243.

As is further apparent from FIG. 3, the gate of the p-channel field effect transistor 227 is biased to a voltage U_refc with the help of voltage source 250.

In addition, the line 240, connected with the plus inputs of the operational amplifiers 204*b*, 204*a* is biased to a voltage U_refd with the help of a voltage source 251 connected via a line 242 with the line 240.

With the help of the circuit device 200 the electrical input signals (currents I_1 and I_2) present on lines 205, 206 can be subtracted from each other; the resulting difference between the input signals and/or currents I_1 and I_2 are mirrored back by the current I_diff present on line 213.

By means of the above biases (voltage U_refd, and voltage U_refc) the operating point of the circuit device 200 can be correspondingly adjusted.

As is apparent from FIG. 3, a resistor R (resistor 300), and a capacitor C (capacitor 301)—connected in series—can be provided for frequency compensation, in particular for frequency compensation at the point of the drain of the n-channel field effect transistor 224 (transistor T9) between line 236 and line 215. Alternatively frequency compensation of this kind can also be dispensed with.

With the circuit device 200 illustrated in FIG. 3, point B of the circuit device 200 (i.e. the point of the drain of the n-channel field effect transistor 203) is held at the same potential as point A (i.e. the point of the drain and of the gate of the n-channel field effect transistor 202) with the help of the regulating transistor T3 (n-channel field effect transistor 223), and with the operational amplifier 204*c* functioning as a variable gain amplifier.

If for instance a lower potential is present at point B than at point A, the operational amplifier 204*c* causes the gate potential of the n-channel field effect transistor 223, and thereby also the potential at point B, to be increased.

If, in contrast, a higher potential is present at point B than at point A, the operational amplifier 204*c* causes the gate-potential of the n-channel field effect transistor 223, and thereby also the potential at point B, to be reduced.

The n-channel field effect transistor 222 (transistor T4) serves—together with the operational amplifier 204*b*—as a cascode circuit, with the help of which the potential at the drain of the n-channel field effect transistor 221 (transistor T6) is constantly held at the voltage U_refd.

The n-channel field effect transistor 221 (transistor T6) represents the actual current sink for the current I_diff—mirroring the difference between the input signals and/or currents I_1 and I_2—present on line 213.

The n-channel field effect transistor 225 (transistor T7) is not a compelling necessity for the actual current subtraction; it serves as a current mirroring device for generating an output current I_out—mirroring the current I_diff—flowing through line 243 where it can be tapped for further processing.

Correspondingly similar to the n-channel field effect transistor 225 (transistor T7), the n-channel field effect transistor 226 (transistor T5) and the operational amplifier 204*a* are also not a compelling necessity for the actual current subtraction: The n-channel field effect transistor 226 (transistor T5) and the operational amplifier 204*a* serve as a cascode circuit, with the help of which the potential at the drain of the n-channel field effect transistor 225 (transistor T7) is—also—constantly held at the voltage U_refd.

The field effect transistors 220, 224, 228 (transistors T8, T9, T10) are connected—as illustrated in FIG. 3—as current sources.

The n-channel field effect transistor 220 (transistor T8) functions as a current sink and also ensures that when the current I_diff present on line 213 is equal to 0, a drain current flows through the regulating transistor T3 (n-channel field effect transistor 223). In this way—and also when current I_diff=0—the functional capability of the regulating mechanism is ensured.

The components used in the circuit device 200, in particular the field effect transistors 220, 224, 228 (transistors T8, T9, T10) should be of such dimensions that approximately the following applies to the currents I_T8, I_T9, and I_T10 flowing through the corresponding transistors, in particular through their source drain paths:

$$I\_T8 \approx I\_T10 - I\_T9 \quad \text{(equation (1))}$$

By reason of process and/or manufacturing inaccuracies, temperature variations etc. the conditions defined in equation (1) cannot be exactly maintained.

This is not a compelling necessity for the functionality of the circuit device 200; the currents I_diff and/or I_out present on line 213 and/or line 243—even when the conditions in the above equation (1) are only approximately maintained—mirror the difference between the input signals and/or currents I_1 and I_2 with a high degree of relative accuracy. The following equation namely applies:

$$\Delta I\_\mathrm{diff} = \Delta I\_2 - \Delta I\_1 \quad \text{(equation (2))}$$

Changes in the current difference are therefore highly accurately relayed to the output of the circuit device 200. The reason for this is, that—as described above—the potential at point B is (quickly and accurately) adjusted to the potential at point A.

The above relatively high accuracy is also achieved by the drain of the n-channel field effect transistor 224 (transistor T9) lying at a high-resistive potential, so that the gate-potential of the n-channel field effect transistor 221 (transistor T6) can be quickly regulated with a substantial lift.

A regulating loop with high loop amplification is created by the field effect transistors 223, 221, 224, 228 (transistors T3, T6, T9, T10). This has the effect that the source potential of the n-channel field effect transistor 223 (transistor T3) follows the gate potential of the n-channel field effect transistor 223 with a high degree of accuracy. The more, highly impedant the point at the drain of the n-channel field effect transistor 224 (transistor T9), the higher the loop amplification.

The p-channel field effect transistor 227 (transistor T11) operates as a cascode and establishes the drain potentials of the transistors T3 and T10.

As the potential of an NMOS diode is present at point B, the transistors T3 and T10 can manage with saturation voltages that do not have to be too low.

Only transistors of one and the same type (here: n-channel field effect transistors) are used in the actual signal path of the circuit device 200 shown in FIG. 3.

For this reason relatively high robustness against process and/or manufacturing inaccuracies and/or temperature variations can be ensured for the circuit device 200.

In addition, a high critical frequency can be achieved in the circuit device 200 by means of the quick-action regulating loop described above (and the use of only one type of active component in the signal path (here: n-channel field effect transistors)).

In an alternative version of the circuit device 200 it can for example also be constructed conversely (whereby n-channel field effect transistors are for example substituted by corresponding p-channel field effect transistors, and conversely p-channel field effect transistors are for example substituted by corresponding n-channel field effect transistors (and correspondingly the ground and supply voltage connections are also reversed in contrast with the configuration shown in FIG. 3)).

In a further alternative version, the circuit device 200 (in particular the transistors provided there) can be constructed—instead of as in the embodiment example described above in NMOS and/or PMOS technology—in bipolar and/or BiCMOS technology, etc.

What is claimed is:

1. A circuit for the subtraction of input electrical signals, the circuit comprising:

regulating loops, wherein each regulating loop comprises at least one amplifier unit;

a subtraction device for subtracting a derived signal representing the difference between the input electrical signals, from one of the input electrical signals, said derived signal made available by the circuit; and a mirroring device for mirroring the derived signal and representing the difference between the input electrical signals.

2. The circuit according to claim 1, in which potentials on lines carrying the electrical signals are maintained at a same value with help of a first one of the regulating loops.

3. The circuit according to claim 1, further comprising transistors in the signal path of the circuit, wherein the transistors provided in the signal path of the circuit device are a same type.

4. The circuit according to claim 3, wherein the transistors provided in the signal path of the circuit device are NMOS field effect transistors.

5. The circuit according to claim 3, wherein the transistors provided in the signal path of the circuit device are PMOS field effect transistors.

6. A procedure for the subtraction of input electrical signals, comprising:

providing at least two regulating loops, a first one of said regulating loops comprising at least one amplifier unit, and a second one of said regulating loops comprising at least one amplifier unit that is a different amplifier unit than the amplifier unit of said first regulating loop;

maintaining potentials on lines carrying the electrical signals at a same value; and mirroring a derived signal representing the difference between the input electrical signals.

7. The procedure according to claim 6, further comprising subtracting a signal, representing a difference between the electrical signals, from one of the electrical signals.

8. The circuit device according to claim 3, further comprising additional subtracting devices for subtracting other electrical signals made available by the circuit device and representing the difference between the other electrical signals, from one of the electrical signals.

9. A circuit for the subtraction of input electrical signals, the circuit comprising:

regulating loops, wherein each regulating loop comprises at least one amplifier unit;

transistors in a signal path of the circuit device, wherein the transistors provided in the signal path of the circuit are a same type; and a mirroring device for mirroring a signal made available by the circuit and representing a difference between the input electrical signals.

10. The circuit according to claim 9, wherein the transistors provided in the signal path of the circuit device are NMOS field effect transistors.

11. The circuit according to claim 9, wherein the transistors provided in the signal path of the circuit device are PMOS field effect transistors.

12. The circuit device according to claim 9, further comprising additional subtracting devices for subtracting other electrical signals made available by the circuit device and representing the difference between the other electrical signals, from one of the electrical signals.

13. A circuit for the subtraction of input electrical signals, the circuit comprising:

at least a first regulating loop and a second regulating loop, wherein said first regulating loop comprises a first amplifier unit and said second regulating loop comprises a second amplifier unit different than said amplifier unit of said first regulating loop; and a subtraction device for subtracting a derived signal representing the difference between the input electrical signals, from one of the input electrical signals, said derived signal made available by the circuit.

14. The circuit according to claim 13, further comprising a mirroring device for mirroring the signal made available by the circuit device and representing the difference between the electrical signals.

15. The circuit according to claim 13, in which potentials on lines carrying the electrical signals are maintained at a same value with help of a first one of the regulating loops.

16. The circuit according to claim 13, further comprising transistors in the signal path of the circuit wherein the transistors provided in the signal path of the circuit are a same type.

17. The circuit according to claim 13, wherein the transistors provided in the signal path of the circuit device are NMOS field effect transistors.

18. The circuit according to claim 13, wherein the transistors provided in the signal path of the circuit device are PMOS field effect transistors.

19. A circuit for the subtraction of input electrical signals carried on a first input line and a second input line, the circuit comprising:

a current mirror connected to the first input line and the second input line for subtracting a derived signal representing the difference between the input electrical signals from one of the input electrical signals; and at least one regulating loop for maintaining potentials on the input lines at a same value.

* * * * *